US010037103B2

(12) United States Patent
Su et al.

(10) Patent No.: US 10,037,103 B2
(45) Date of Patent: Jul. 31, 2018

(54) GATE DRIVING CIRCUIT, TOUCH DISPLAY PANEL AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Qiujie Su, Beijing (CN); Feng Li, Beijing (CN)

(73) Assignees: BOE TECHNOLOGY GROUP, LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 85 days.

(21) Appl. No.: 15/222,531

(22) Filed: Jul. 28, 2016

(65) Prior Publication Data

US 2017/0235406 A1    Aug. 17, 2017

(30) Foreign Application Priority Data

Feb. 15, 2016    (CN) .......................... 2016 1 0086255

(51) Int. Cl.
G06F 3/041    (2006.01)
G09G 5/00    (2006.01)
G11C 19/28    (2006.01)

(52) U.S. Cl.
CPC .......... *G06F 3/0416* (2013.01); *G06F 3/0412* (2013.01); *G09G 5/003* (2013.01); *G11C 19/28* (2013.01); *G09G 2310/0286* (2013.01)

(58) Field of Classification Search
CPC ..... G06F 3/0416; G06F 3/0412; G09G 5/003; G09G 2310/0286
See application file for complete search history.

(56) References Cited

U.S. PATENT DOCUMENTS

2017/0178584 A1*    6/2017    Ma ....................... G09G 3/3677

* cited by examiner

*Primary Examiner* — Lisa Landis
(74) *Attorney, Agent, or Firm* — Kinney & Lange, P.A.

(57) ABSTRACT

The present disclosure provides a gate driving circuit in which a node potential compensation unit connected to a touch switch terminal is provided between pull-up nodes of two stages of shift register units of each preset unit group. The node potential compensation unit may compensate for, under the control of both of a pull-up node of a previous stage of shift register unit and the touch switch terminal, a potential of a pull-up node of a next stage of shift register unit, and may enable the potential of the pull-up node of the next stage of shift register unit to be in a stable state, so as to improve the stability of the potential of the gate turn-on signal output by the next stage of shift register unit, thereby enabling a TFT of a pixel region in a corresponding line to be normally turned on and improving a display performance.

13 Claims, 8 Drawing Sheets

GATE DRIVING CIRCUIT, TOUCH DISPLAY PANEL AND DISPLAY APPARATUS

TECHNICAL FIELD

The present disclosure relates to the display technology field, in particular, to a gate driving circuit, a touch display panel and a display apparatus.

BACKGROUND

In a flat display panel, a gate turn-on signal is typically provided to a gate of a respective Thin Film Transistor (TFT) of a pixel region by a gate driving circuit. The gate driving circuit may be formed on an array substrate of the flat display panel through an array process, i.e., a Gate Driver on Array (GOA) process. This integration process not only saves cost, but also achieves an aesthetic design in which the flat display panel is bilaterally symmetrical. Meanwhile, a bonding area of a gate Integrated Circuit (IC) and a wiring space of Fan-out are omitted, therefore achieving a design with a narrow border.

As illustrated in FIG. 1, the existing gate driving circuit consists of multiple cascaded shift register units, SR(1), SR(2) . . . SR(n), SR(n+1) . . . SR(N−1), SR(N) (N shift register units in total, with 1≤n≤N), and each stage of the shift register unit SR(n) is used for providing a gate turn-on signal to a gate line connected with a signal output terminal Output_n of the stage of the shift register unit SR(n), so as to turn on a TFT of a pixel region of a corresponding line. Wherein, each of the signal input terminals Input_n of the remaining stages of the shift register units SR(n) except for a first stage of shift register unit SR(1) is connected to a signal output terminal Output_n−1 of a previous stage of shift register units SR(n−1). Each stage of shift register units SR(n) includes a pull-up node for controlling the signal output terminal to output the gate turn-on signal, and when the potential of the pull-up node is further pulled up, the signal output terminal outputs the gate turn-on signal.

Presently, in a touch display panel in which touch and display are driven at different times (i.e., multiple touch periods are inserted in the time of displaying one frame of picture, and in general each touch period needs a time interval with a certain duration), assuming that a touch period is entered after the outputting of the gate turn-on signal by the signal output terminal of the nth stage of the shift register unit is completed, at this time, the potential of the pull-up node in a(n+1)th stage of shift register unit has already become a high potential, the interval of the touch period is relatively long, during which a leakage will occur through a TFT to which the pull-up node in the (n+1)th stage of shift register unit is connected, which will lead to a potential reduction in the pull-up node. When the touch period ends, the (n+1)th stage of shift register unit starts to operate. Since the potential of its pull-up node is reduced, the gate turn-on signal output by the signal output terminal of the shift register unit will also be reduced, which may even lead to a situation in which the TFT in the pixel region cannot be turned on, and eventually cause an abnormal operation of the touch display panel.

SUMMARY

Embodiments of the disclosure provide a gate driving circuit, a touch display panel and a display apparatus, to solve a problem of the gate driving circuit in which a potential reduction in a pull-up node of a next stage of shift register unit is caused by insertion of a touch phase with a relatively large time interval between some two adjacent shift register units outputting gate turn-on signals.

Therefore, an embodiment of the disclosure provides a gate driving circuit, including multiple cascaded shift register units, each stage of shift register unit at least includes a signal input terminal, a signal output terminal and a pull-up node for controlling the signal output terminal to output a gate turn-on signal, and each of signal input terminals of remaining various stages of shift register units except for a first stage of shift register unit is connected to a signal output terminal of a previous stage of shift register unit, wherein, any two adjacent stages of shift register units constitute a unit group, the gate driving circuit further includes at least one node potential compensation unit, each of which is connected between pull-up nodes of the two stages of shift register units of each preset unit group in at least one preset unit group, and the node potential compensation unit is further connected to a touch switch terminal; and each node potential compensation unit is used to compensate for, under the control of both of a pull-up node of a previous stage of shift register unit in the unit group connected to the node potential compensation unit and the touch switch terminal, a potential of a pull-up node of a next stage of shift register unit in the unit group, in a preset period of a touch phase.

In a possible implementation, in the gate driving circuit according to an embodiment of the disclosure, the node potential compensation unit is provided between pull-up nodes of the two stages of shift register units of each unit group in all of the unit groups.

In a possible implementation, in the gate driving circuit according to an embodiment of the disclosure, the node potential compensation unit includes:

an input control module, having a first terminal connected to the pull-up node of the previous stage of shift register unit in the unit group connected to the node potential compensation unit, a second terminal connected to a first control node, the input control module is used to provide, under the control of the pull-up node of the previous stage of shift register unit, a signal of the pull-up node of the previous stage of shift register unit to the first control node;

a reset control module, having a first terminal connected to a signal output terminal of the next stage of shift register unit in the unit group, a second terminal connected to a reference signal terminal, a third terminal connected to the first control node, the reset control module is used to provide, under the control of the signal output terminal, a signal of the reference signal terminal to the first control node;

a potential control module, having a first terminal connected to the first control node, a second terminal connected to the touch switch terminal, a third terminal connected to a second control node, the potential control module is used to provide, under the control of the first control node, a signal of the touch switch terminal to the second control node; and a potential output module, having a first terminal connected to the second control node, a second terminal connected to the touch switch terminal, a third terminal connected to the pull-up node of the next stage of shift register unit in the unit group, the potential output module is used to provide, under the control of the second control node, a signal of the touch switch terminal to the pull-up node of the next stage of shift register unit.

In a possible implementation, in the gate driving circuit according to an embodiment of the disclosure, the input control module includes a first switch transistor, The first switch transistor has a gate and a source being the first terminal of the input control module, and a drain being the second terminal of the input control module.

In a possible implementation, in the gate driving circuit according to an embodiment of the disclosure, the reset control module includes a second switch transistor, The second switch transistor has a gate being the first terminal of the reset control module, a source being the second terminal of the reset control module, and a drain being the third terminal of the reset control module.

In a possible implementation, in the gate driving circuit according to an embodiment of the disclosure, the potential control module includes a third switch transistor, The third switch transistor has a gate being the first terminal of the potential control module, a source being the second terminal of the potential control module, and a drain being the third terminal of the potential control module.

In a possible implementation, in the gate driving circuit according to an embodiment of the disclosure, the potential output module includes a fourth switch transistor, The fourth switch transistor has a gate being the first terminal of the potential output module, a source being the second terminal of the potential output module, and a drain being the third terminal of the potential output module.

In a possible implementation, in the gate driving circuit according to an embodiment of the disclosure, when the gate turn-on signal is at a high potential, all of the switch transistors are N-type switch transistors; or, when the gate turn-on signal is at a low potential, all of the switch transistors are P-type switch transistors.

An embodiment of the disclosure also provides a touch display panel, including any one of the above gate driving circuit according to an embodiment of the disclosure.

An embodiment of the disclosure also provides a display apparatus, including any one of the above touch display panel according to an embodiment of the disclosure.

An embodiment of the disclosure provides a gate driving circuit, touch display panel and display apparatus, in which a node potential compensation unit connected to a touch switch terminal is provided between pull-up nodes of two stages of shift register units of each preset unit group in at least one preset unit group. The node potential compensation unit may compensate for, under the control of both of a pull-up node of a previous stage of shift register unit and the touch switch terminal, a potential of a pull-up node of a next stage of shift register unit, in a preset period of a touch phase. Compared with the exiting gate driving circuit in which a potential reduction in the pull-up node of the next stage of shift register unit is caused by insertion of a touch phase with a relatively large time interval between some two adjacent shift register units outputting gate turn-on signals, the gate driving circuit according to an embodiment of the disclosure may enable the potential of the pull-up node of the next stage of shift register unit to be in a stable state in a preset period of the touch phase by providing the node potential compensation unit, so as to improve the stability of the potential of the gate turn-on signal output by the next stage of shift register unit, thereby enabling a TFT of a pixel region in a corresponding line to be normally turned on and improving a display performance.

BRIEF DESCRIPTION OF THE DRAWINGS

FIG. 5a is a circuit timing diagram of the node potential compensation unit illustrated in FIG. 4a;

DETAILED DESCRIPTION

In order to make aspects and advantages of the present disclosure more apparent, specific implementations of a gate driving circuit, a touch display panel and a display apparatus according to embodiments of the present disclosure will be described in detail below in conjunction with accompanying drawings.

Figure 1:
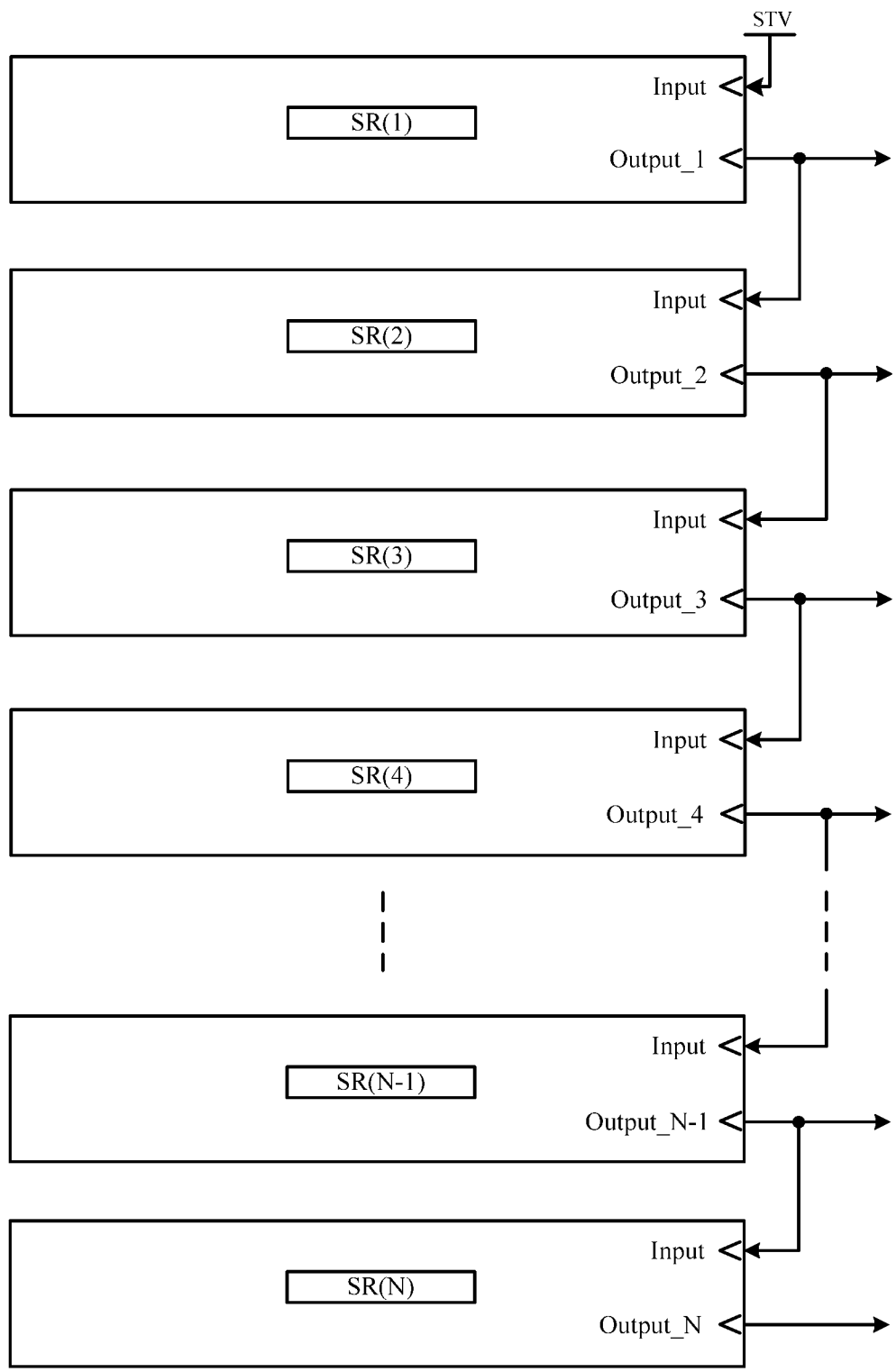
FIG. 1 is a structural diagram of an existing gate driving circuit.
Figure 2:
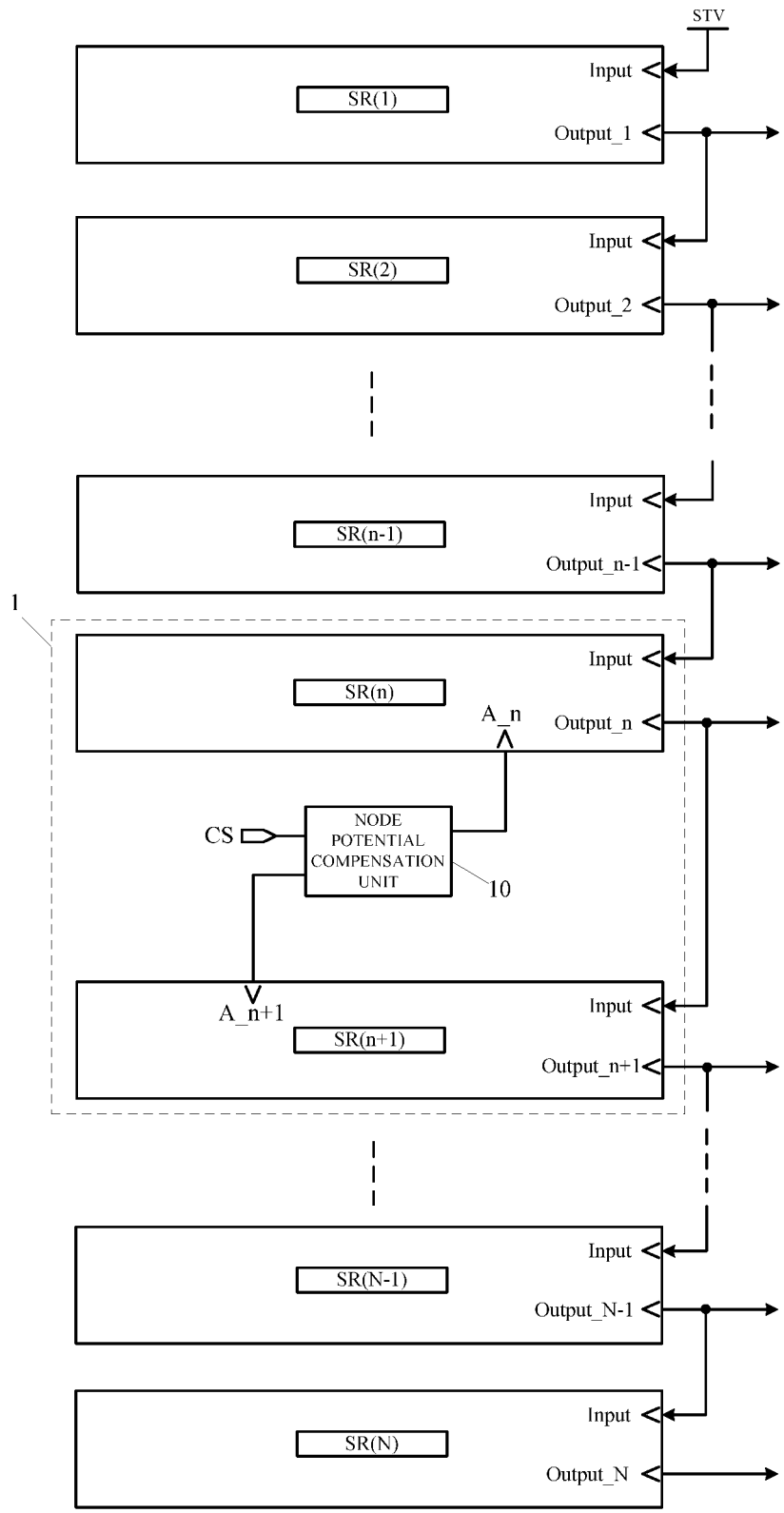
FIG. 2 is a structural diagram of a gate driving circuit according to an embodiment of the present disclosure.

As illustrated in FIG. 2, a gate driving circuit according to an embodiment includes multiple cascaded shift register units, SR(1), SR(2) . . . SR(n−1), SR(n), SR(n+1) . . . SR(N−1), SR(N) (N shift register units in total, with $1 \leq n \leq N$), wherein each stage of the shift register unit SR(n) at least comprises a signal input terminal Input, a signal output terminal Output_n, and a pull-up node A_n for controlling a signal output terminal Output_n to output a gate turn-on signal. Each of the signal input terminals Input of the remaining stages of the shift register units SR(n) except for a first stage of shift register unit SR(1), is connected to a signal output terminals Output_n−1 of a previous stage of shift register units SR(n−1).

Any two adjacent stages of shift register units SR(n) and SR (n+1) constitute a preset unit group 1. The gate driving circuit further includes: at least one node potential compensation unit 10, each of which is connected between pull-up nodes A_n and A_n+1 of the two stages of shift register units of each unit group 1 in at least one preset unit group 1 (only two stages of shift register units is illustrated in FIG. 2 as an example), and the node potential compensation unit 10 is further connected to a touch switch terminal CS.

The node potential compensation unit 10 is used to compensate for, under the control of both of a pull-up node A_n of a previous stage of shift register unit SR(n) in the unit group 1 connected to the node potential compensation unit 10 and the touch switch terminal CS, a potential of a pull-up node A_n+1 of a next stage of shift register unit SR(n+1) in the unit group 1, in a preset period of a touch phase.

An embodiment of the disclosure provides a gate driving circuit, in which a node potential compensation unit connected to a touch switch terminal is provided between pull-up nodes of two stages of shift register units of each present unit group in at least one preset unit group. The node potential compensation unit may compensate for, under the control of both of a pull-up node of a previous stage of shift register unit and the touch switch terminal, a potential of a pull-up node of a next stage of shift register unit connected to the node potential compensation unit, in a preset period of a touch phase. Compared with the exiting gate driving circuit in which a potential reduction in the pull-up node of the next stage of shift register unit is caused by insertion of a touch phase with a relatively large time interval between some two adjacent shift register units outputting gate turn-on signals, the gate driving circuit according to an embodiment of the disclosure may enable the potential of the pull-up node of the next stage of shift register unit to be in a stable state in a preset period of the touch phase by providing the node potential compensation unit, so as to improve the stability of the potential of the gate turn-on signal output by the next stage of shift register unit, thereby enabling a TFT of a pixel region in a corresponding line to be normally turned on and improving the display performance.

In specific implementations, when the gate driving circuit according to an embodiment of the present disclosure is applied to a touch display panel adopting a method of driving at different times, usually multiple touch phases are inserted uniformly during one frame of picture is displayed, to achieve a display function and a touch function of a touch display panel. Therefore in specific implementations, the position of a preset unit group in the gate driving circuit of an embodiment of the disclosure is determined, according to an insertion time of a touch phase. For example, assuming the gate driving circuit of an embodiment of the disclosure includes 50 stages of shift register units and 5 touch phases are inserted during one frame of picture is displayed, 5 unit groups need to be preset to ensure that after entering a touch phase, a pull-up node of a next stage of shift register unit connected to the node potential compensation unit is compensated. Therefore, the preset first unit group includes: a 9th shift register unit and a 10th shift register unit; the preset second unit group includes: a 19th shift register unit and a 20th shift register unit; the preset third unit group includes: a 29th shift register unit and a 30th shift register unit; the preset fourth unit group includes: a 39th shift register unit and a 40th shift register unit; the preset fifth unit group includes: a 49th shift register unit and a 50th shift register unit. Of course, the preset unit group is determined as needed, and is not limited herein.

In specific implementations, since in the above embodiments, the node potential compensation unit is only provided between pull-up nodes of two shift register units of preset several unit groups, although a potential of a pull-up node of a next stage of shift register unit may be compensated in a preset period of a touch phase, the touch phases inserted during one frame of picture is displayed is fixed, therefore it is not useful to adjust the position of the touch phase in the display of a frame of picture, hence preferably, in the gate driving circuit according to an embodiment of the disclosure, the node potential compensation unit may be provided between pull-up nodes of two stages of shift register units in each of all of the unit groups. Since the node potential compensation unit is provided between pull-up nodes of any two adjacent stages of shift register units, the potential of the pull-up node of each of remaining stage of shift register unit except for the first stage of shift register unit may be compensated, therefore, a touch phase may be entered after a gate turn-on signal is outputted by any one stage of shift register unit among the various stage of shift register unit, and after the touch phase ends, a next stage of shift register unit may output the gate turn-on signal normally.

The present disclosure will be described in detail below in conjunction with a specific embodiment. It should be noted that the present embodiment is provided for the purpose of better understanding the present disclosure instead of limiting the present disclosure.

Figure 3:
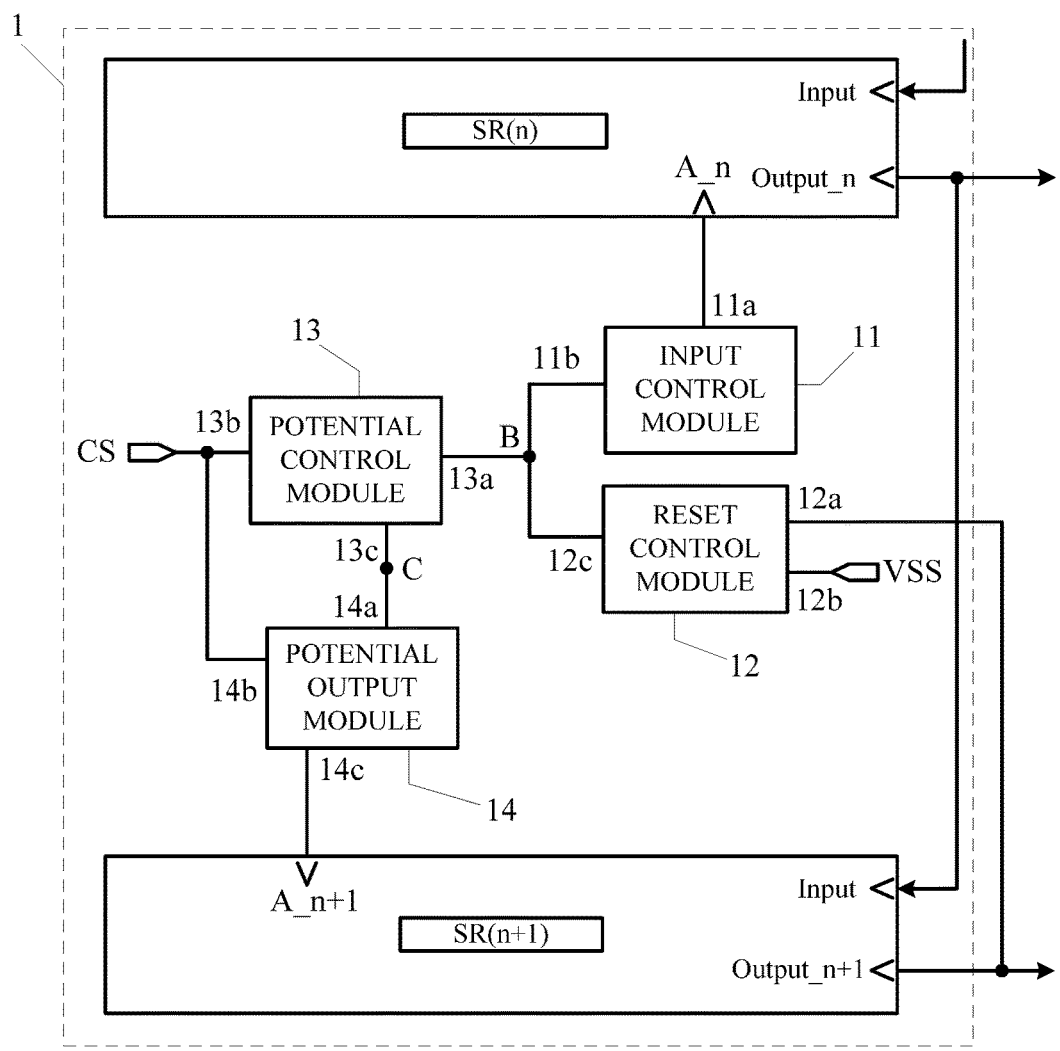
FIG. 3 is a structural diagram of a node potential compensation unit according to an embodiment of the present disclosure.

Specifically, in specific implementations, in the gate driving circuit according to an embodiment of the disclosure, as illustrated in FIG. 3, a node potential compensation unit includes: an input control module 11, a reset control module 12, a potential control module 13 and a potential output module 14.

The input control module 11 has a first terminal 11a being connected to a pull-up node A_n of a previous stage of shift register unit SR(n) in the unit group 1 including the node potential compensation unit, and a second terminal 11b being connected to a first control node B. The input control module 11 is used to provide, under the control of the pull-up node A_n of the previous stage of shift register unit SR(n), a signal of the pull-up node A_n of the previous stage of shift register unit SR(n) to the first control node B.

The reset control module 12 has a first terminal 12a being connected to a signal output terminal Output_n+1 of a next stage of shift register unit SR(n+1) in the unit group 1, a second terminal 12b being connected to a reference signal terminal VSS, and a third terminal 12c being connected to the first control node B. The reset control module 12 is used to provide, under the control of the signal output terminal Output_n+1, a signal of the reference signal terminal VSS to the first control node B.

The potential control module 13 has a first terminal 13a being connected to the first control node B, a second terminal 13b being connected to the touch switch terminal CS, and a third terminal 13c being connected to a second control node. The potential control module 13 is used to provide, under the control of the first control node B, a signal of the touch switch terminal CS to the second control node C.

The potential output module 14 has a first terminal 14a being connected to the second control node C, a second terminal 14b being connected to the touch switch terminal CS, and a third terminal 14c being connected to a pull-up node A_n+1 of the next stage of shift register unit SR(n+1) in the unit group 1. The potential output module 14 is used to provide, under the control of the second control node C, a signal of the touch switch terminal CS to the pull-up node A_n+1 of the next stage of shift register unit SR(n+1).

In specific implementations, in the gate driving circuit according to an embodiment of the present disclosure, the preset period within the touch phase starts from entering the touch phase. When the gate turn-on signal is at a high potential, a touch switch signal of the touch switch terminal is at a high potential within the preset period of the touch phase, and is at a low potential at other times; when the gate turn-on signal is at a low potential, a touch switch signal of the touch switch terminal is at a low potential within the preset period of the touch phase, and is at a high potential at other times.

The node potential compensation unit according to the disclosure includes: the input control module, the reset control module, the potential control module and the potential output module. During a display phase, when the potential of the pull-up node of the shift register unit connected to the input control module is in an invalid state, the input control module does not function, such that the reset control module, the potential control module and the potential output module do not function either. When the potential of the pull-up node of the shift register unit connected to the input control module is in a valid state, the input control module provides, under the control of the pull-up node of the shift register unit connected thereto, a signal of the pull-up node of the shift register unit to the first control node. The potential control module provides a signal of the touch switch terminal to the second control node under the control of the first control node, since at this time the touch switch terminal is in an invalid state, the signal of the second control node is also in an invalid state, such that the potential output module does not function, therefore the potential output module does not affect a potential of a pull-up node of a shift register unit connected thereto. In summary, during the display phase, the node potential compensation unit does not affect the function of the shift register unit in the gate driving circuit.

During the preset period of the touch phase, i.e., after the gate driving signal is outputted by a signal output terminal of the previous stage of shift register unit connected to the node potential compensation unit, since the pull-up node of the previous stage of shift register unit is still in a valid state without performing a reset operation, the input control module provides a signal of the pull-up node to the first control node under the control of the pull-up node; the potential control module provides a signal of the touch switch terminal to the second control node under the control of the first control node; the potential output module provides the signal of the touch switch terminal to a pull-up node of the next stage of shift register unit under the control of the second control node. Since the potential of the touch switch terminal is in a valid state, it can be ensured that the potential of the pull-up node of the next stage of shift register unit is in a valid state. Therefore, no matter how large the time interval of the two adjacent shift register units outputting the gate turn-on signals, the potential of pull-up node of the next stage of shift register unit will not be reduced over time, but always remains a potential as in a valid state, thus it can be ensured that after the touch phase ends, the next stage of shift register unit may output normally under the control of its pull-up node.

Also, the touch phase further includes a period from the end of the preset period to the end of the touch phase, and the time interval of this period is very small, usually in an order of microsecond (e.g. set to be 3 μs). This is because when the preset period of the touch phase is from the start of the touch phase to the end of the touch phase, when the touch phase is changed to a display phase, the potential control module provides a signal of the touch switch terminal in a valid state to the second control node under the control of the first control node. The potential output module provides a signal of the touch switch terminal in a valid state to the pull-up node of the next stage of shift register unit connected thereto under the control of the second control node, thus this may affect the potential of the pull-up node of the next stage of shift register unit. When the potential of the pull-up node of the next stage of shift register unit is compensated by setting a preset period during the touch phase, and then a period with a very small time interval is set between the end of the preset period and the end of the touch phase, an influence of the signal of the touch switch terminal on the potential of the pull-up node of the next stage of shift register unit can be avoided when the touch phase is changed to the display phase. Also, during the touch phase, since the time interval set for this period is very small, the potential of the pull-up node of the next stage of shift register unit will not be reduced, therefore the potential of the pull-up node of the next stage of shift register unit will not be affected.

In addition, since the reset control module is connected to the signal output terminal of the next stage of shift register unit, after the touch phase ends and the display phase is entered, the signal output terminal of the next stage of shift register unit outputs a gate turn-on signal. The reset control module provides the signal of the reference signal terminal to the first control node under the control of the gate turn-on signal, such that the reset control module does not work under the control of the first control node, thereby it is further ensured that the node potential compensation unit stops compensating for the potential of the pull-up node of the next stage of shift register unit. Therefore, when the touch phase is entered again during a frame of picture is displayed, for the above node potential compensation unit, since the rest control module resets the first control node, there would be no influence on the potential of the pull-up node of the next stage of shift register unit.

Figure 4A:
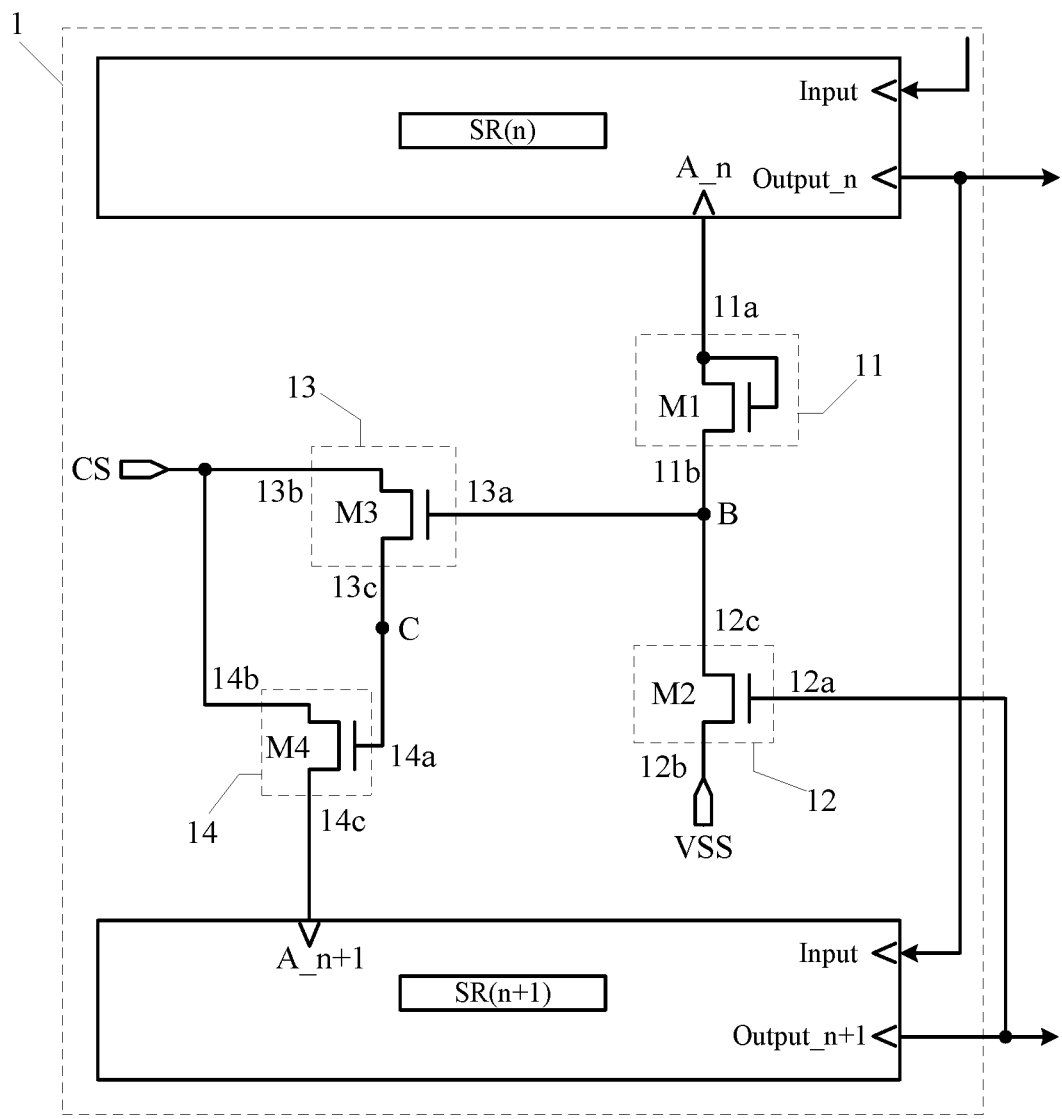
FIG. 4a is a specific structural diagram of a node potential compensation unit in which all of the switch transistors are N-type switch transistors according to an embodiment of the present disclosure.
Figure 4B:
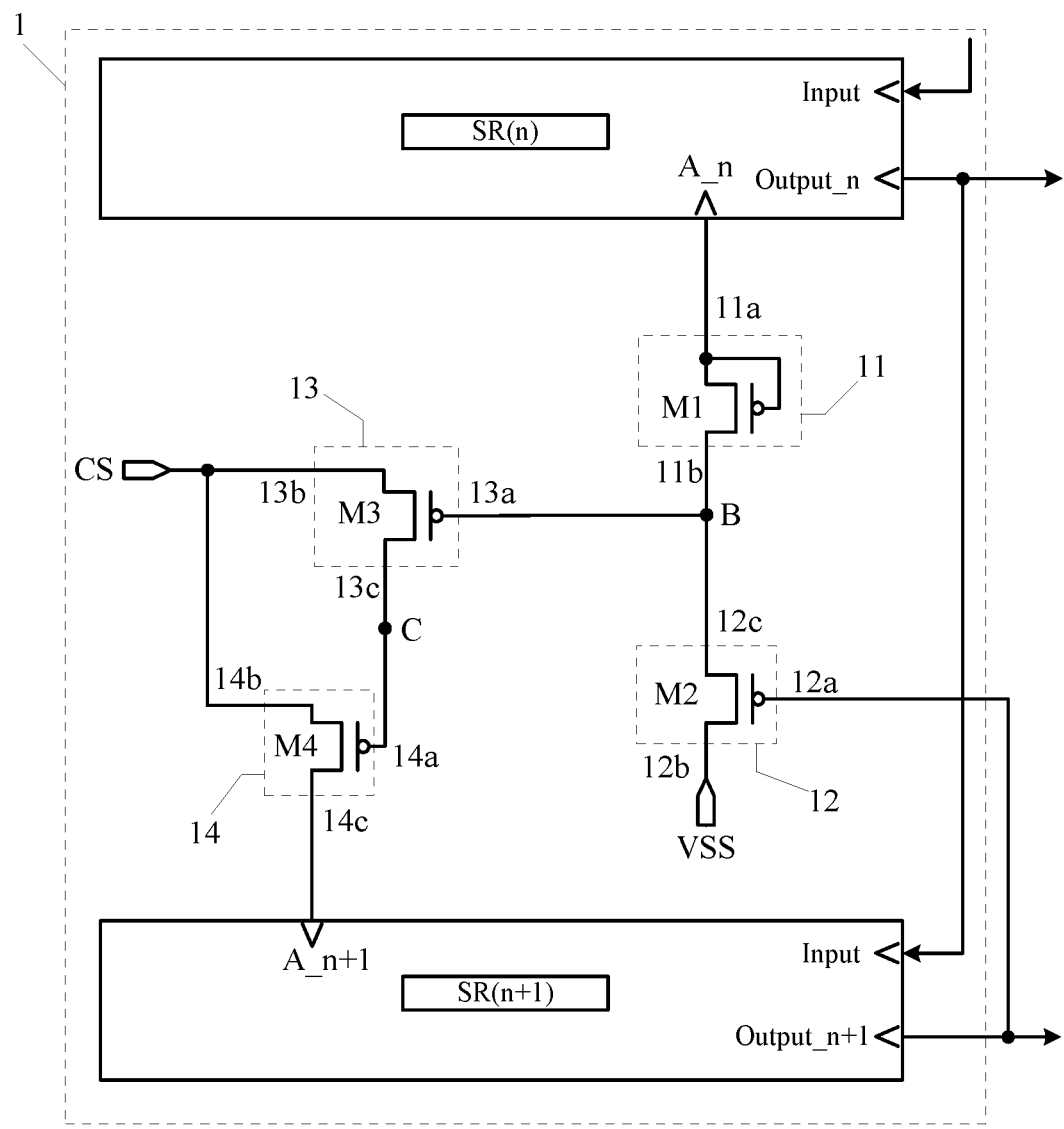
FIG. 4b is a specific structural diagram of a node potential compensation unit in which all of the switch transistors are P-type switch transistors according to an embodiment of the present disclosure.

Specifically, in specific implementations, in the gate driving circuit according to embodiments of the disclosure, as illustrated in FIGS. 4a and 4b, the input control module may include a first switch transistor M1.

The first switch transistor M1 has a gate and a source being the first terminal 11a of the input control module 11, and a drain being the second terminal 11b of the input control module 11.

In specific implementations, in the gate driving circuit according to embodiments of the disclosure, as illustrated in FIG. 4a, when the gate turn-on signal is at a high potential, the first switch transistor M1 is a N-type switch transistor; or, as illustrated in FIG. 4b, when the gate turn-on signal is at a low potential, the first switch transistor M1 is a P-type switch transistor.

In specific implementations, in the gate driving circuit according to embodiments of the disclosure, as illustrated in FIGS. 4a and 4b, the first switch transistor M1 is turned on, and provides, under the control of the first terminal 11a (i.e., the pull-up node A_n of the previous stage of shift register unit SR(n) in the unit group 1 connected to the node potential compensation unit) of the input control module 11, the signal of the pull-up node A_n to the second terminal 11b (i.e., the first control node B) of the input control module 11.

The above only illustrates the specific structure of the input control module in the node potential compensation unit as an example. In specific implementations, the specific structure of the input control module is not limited to the above structure according to embodiments of the disclosure, and may be other structures known to those skilled in the art, which is not limited here.

Specifically, in specific implementations, in the gate driving circuit according to embodiments of the disclosure, as illustrated in FIGS. 4a and 4b, the reset control module 12 may include a second switch transistor M2.

The second switch transistor M2 has a gate being the first terminal 12a of the reset control module 12, a source being the second terminal 12b of the reset control module 12, and a drain being the third terminal 12c of the reset control module 12.

In specific implementations, in the gate driving circuit according to embodiments of the disclosure, as illustrated in FIG. 4a, when the gate turn-on signal is at a high potential, the second switch transistor M2 is a N-type switch transistor; or, as illustrated in FIG. 4b, when the gate turn-on signal is at a low potential, the second switch transistor M2 is a P-type switch transistor.

In specific implementations, in the gate driving circuit according to embodiments of the disclosure, as illustrated in FIGS. 4a and 4b, the second switch transistor M2 provides, under the control of the first terminal 12a (i.e., the signal output terminal Output_n+1 of the next stage of shift register unit SR(n+1) in the unit group 1) of the reset control module 12, the signal of the second terminal 12b (i.e., the reference signal terminal VSS) of the reset control module 12 to the third terminal 12c (i.e., the first control node B) of the reset control module 12.

The above only illustrates the specific structure of the reset control module in the node potential compensation unit as an example. In specific implementations, the specific structure of the reset control module is not limited to the above structure according to embodiments of the disclosure, and may be other structures known to those skilled in the art, which is not limited here.

Specifically, in specific implementations, in the gate driving circuit according to embodiments of the disclosure, as illustrated in FIGS. 4a and 4b, the potential control module 13 may include a third switch transistor M3.

The third switch transistor M3 has a gate being the first terminal 13a of the potential control module 13, a source being the second terminal 13b of the potential control module 13, and a drain being the third terminal 13c of the potential control module 13.

In specific implementations, in the gate driving circuit according to embodiments of the disclosure, as illustrated in FIG. 4a, when the gate turn-on signal is at a high potential, the third switch transistor M3 is a N-type switch transistor; or, as illustrated in FIG. 4b, when the gate turn-on signal is at a low potential, the third switch transistor M3 is a P-type switch transistor.

In specific implementations, in the gate driving circuit according to embodiments of the disclosure, as illustrated in FIGS. 4a and 4b, when the third switch transistor M3 is in a turn-on state under the control of the first terminal 13a (i.e., the first control node B) of the potential control module 13, it provides the signal of the second terminal 13b (i.e., the touch switch terminal CS) of the potential control module 13 to the third terminal 13c (i.e., the second control node C) of the potential control module 13.

The above only illustrates the specific structure of the potential control module in the node potential compensation unit as an example. In specific implementations, the specific structure of the potential control module is not limited to the above structure according to embodiments of the disclosure, and may be other structures known to those skilled in the art, which is not limited here.

Specifically, in specific implementations, in the gate driving circuit according to embodiments of the disclosure, as illustrated in FIGS. 4a and 4b, the potential output module 14 may include a fourth switch transistor M4.

The fourth switch transistor M4 has a gate being the first terminal 14a of the potential output module 14, a source being the second terminal 14b of the potential output module 14, and a drain being the third terminal 14c of the potential output module 14.

In specific implementations, in the gate driving circuit according to embodiments of the disclosure, as illustrated in FIG. 4a, when the gate turn-on signal is at a high potential, the fourth switch transistor M4 is a N-type switch transistor; or, as illustrated in FIG. 4b, when the gate turn-on signal is at a low potential, the fourth switch transistor M4 is a P-type switch transistor.

In specific implementations, in the gate driving circuit according to embodiments of the disclosure, as illustrated in FIGS. 4a and 4b, the fourth switch transistor M4 provides, under the control of the first terminal 14a (i.e., the second control node C) of the potential output module 14, the signal of the second terminal 14b (i.e., the touch switch terminal CS) of the potential output module 14 to the third terminal 14c (i.e., the pull-up node A_n+1 of the shift register unit SR(n+1) connected to the potential output module 14) of the potential output module 14, so as to compensate for the potential of the pull-up node A_n+1.

The above only illustrates the specific structure of the potential output module in the node potential compensation unit as an example. In specific implementations, the specific structure of the potential output module is not limited to the above structure according to embodiments of the disclosure, and may be other structures known to those skilled in the art, which is not limited here.

In specific implementations, in the gate driving circuit according to embodiments of the disclosure, since the node potential compensation unit is only used to compensate for the potential of the pull-up node of the next stage of shift register unit, but not to implement a driving capability of outputting the gate driving signal by the shift register unit in the gate driving circuit, thus in the process preparation, the requirement to the size of its switch transistor is relatively low. That is, compared with each switch transistor in the shift register unit, the switch transistor in the node potential compensation unit can be very small, so there is little influence on an entire size of the gate driving circuit, and thus an aperture ratio in a touch display panel will not be affected.

Furthermore, in order to lower the preparation process, in specific implementations, in the gate driving circuit according to embodiments of the disclosure, when the gate turn-on signal is at a high potential, all of the switch transistors in each shift register unit and all of the switch transistors in each node potential compensation unit may be N-type switch transistors; or, when the gate turn-on signal is at a low potential, all of the switch transistors in each shift register unit and all of the switch transistors in each node potential compensation unit may be P-type switch transistors, which is not limited herein.

Furthermore, in the gate driving circuit according to an embodiment of the disclosure, the N-type switch transistor is turned on at a high potential, and turned off at a low potential; the P-type switch transistor is turned off at a high potential, and turned on at a low potential.

It should be noted that the switch transistor mentioned above in the embodiments of the disclosure may be a Thin Film Transistor (TFT), and also may be a Metal Oxide Semiconductor (MOS), which is not limited herein. In the specific implementation, the function of the sources and the drains of these transistors may interchange with each other according to the types of the transistors and the input signals, which is not distinguished herein.

In the following, a duration of displaying a frame of picture is divided into multiple display phases and multiple touch phases, and the display phases and the touch phases occurs alternately. Taking the node potential compensation module connected between the pull-up node of the nth shift register unit and the pull-up node of the (n+1)th shift register unit as an example, the operation procedure of the gate driving circuit according to an embodiment of the disclosure is described in combination with a circuit timing diagram. In the description below, '1' denotes a high potential signal, '0' denotes a low potential signal, where '1' and '0' denoting its logical potential is merely used to explain the operation procedure of the gate driving circuit according to an embodiment of the disclosure, rather than being a potential applied to a gate of each switch transistor in the specific implementation.

Embodiment I

Figure 5A:
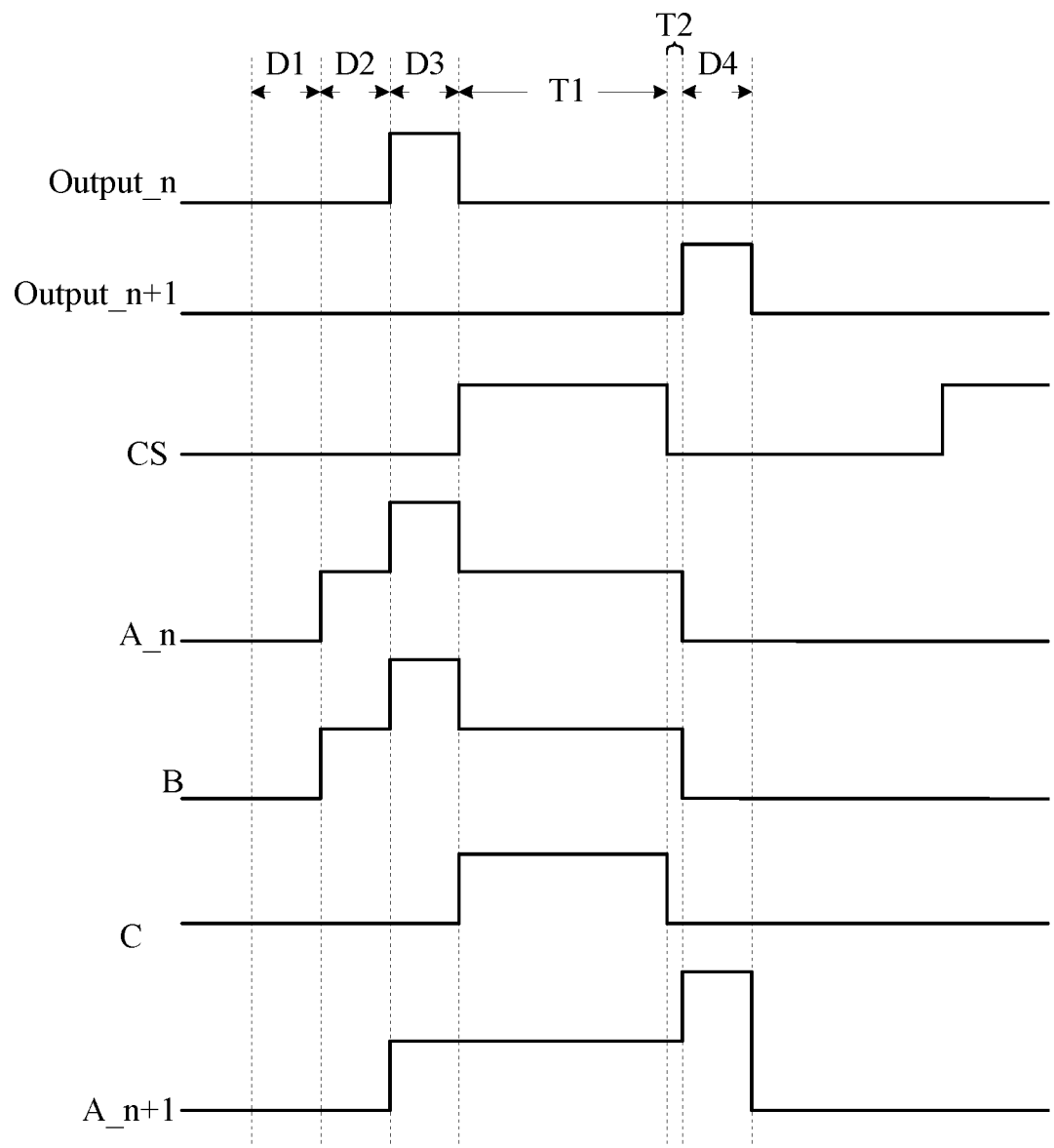

The gate driving circuit as illustrated in FIG. 4a is taken as an example to describe its operation procedure. All of the switch transistors in the node potential compensation unit are N-type switch transistors. The potential of reference signal terminal VSS is low potential. The potential of the touch switch terminal CS is at a high potential in a preset period T1 of the touch phase, and is always at low potential at other times. The corresponding input/output timing diagram is illustrated in FIG. 5a, in particular, six phases—a first display phase D1, a second display phase D2, a third display phase D3, a preset period T1 of the touch phase, a period T2 between the end of the preset period and the end of the touch phase, and a fourth display phase D4—in the input/output timing diagram as illustrated in FIG. 5a are selected.

In the first display phase D1, A_n=0, Output_n+1=0, VSS=0, CS=0. Since A_n=0, the first switch transistor M1 is turned off. Since Output_n+1=0, the second switch transistor M2 is turned off. Therefore, the third switch transistor M3 and the fourth switch transistor M4 do not operate, thus in this phase, the node potential compensation unit does not operate and there is no influence on A_n+1.

In the second display phase D2, A_n=1, Output_n+1=0, VSS=0, CS=0. Since A_n=1, the first switch transistor M1 is turned on. Since Output_n+1=0, the second switch transistor M2 is turned off. Since the first switch transistor M1 is turned on, and provides a signal with a high potential of the pull-up node A_n to the first control node B, the potential of the first control node B is at a high potential, and the third switch transistor M3 is turned on under the control of the first control node B. Since the third switch transistor M3 is turned on and provides a signal with a low potential of the touch switch terminal CS to the second control node C, the potential of the second control node C is low potential, and the fourth switch transistor M4 is turned off under the control of the second control node C, therefore there is no influence on A_n+1 at this phase.

In the third display phase D3, the pull-up node A_n is further pulled up in this phase, A_n=1, Output_n+1=0, VSS=0, CS=0. Since A_n=1, the first switch transistor M1 is turned on. Since Output_n+1=0, the second switch transistor M2 is turned off. Since the first switch transistor M1 is turned on, and provides a signal with a high potential of the pull-up node A_n to the first control node B, the potential of the first control node B is high potential, and the third switch transistor M3 is turned on under the control of the first control node B. Since the third switch transistor M3 is turned on and provides a signal with a low potential of the touch switch terminal CS to the second control node C, the potential of the second control node C is at a low potential, and the fourth switch transistor M4 is turned off under the control of the second control node C, therefore there is no influence on A_n+1 in this phase. However, in this phase, the signal output terminal of the nth shift register unit outputs a gate turn-on signal, and the gate turn-on signal is used as an input signal to the (n+1)th shift register unit, therefore, the pull-up node A_n+1 of the (n+1)th shift register unit is at a high potential.

In the preset period T1 of the touch phase, A_n=1, Output_n+1=0, VSS=0, CS=1. Since A_n=1, the first switch transistor M1 is turned on. Since Output_n+1=0, the second switch transistor M2 is turned off. Since the first switch transistor M1 is turned on, and provides a signal with a high potential of the pull-up node A_n to the first control node B, the potential of the first control node B is at a high potential, and the third switch transistor M3 is turned on under the control of the first control node B. Since the third switch transistor M3 is turned on and provides a signal with a high potential of the touch switch terminal CS to the second control node C, the potential of the second control node C is at a high potential, and the fourth switch transistor M4 is turned on under the control of the second control node C. Since the fourth switch transistor M4 is turned on and provides the signal with a high potential of the touch switch terminal CS to the pull-up node A_n+1, the potential of the pull-up node A_n+1 is high potential, so as to compensate for the potential of the pull-up node A_n+1.

In the period T2 between the end of the preset period and the end of the touch phase, A_n=1, Output_n+1=0, VSS=0, CS=0. Since A_n=1, the first switch transistor M1 is turned on. Since Output_n+1=0, the second switch transistor M2 is turned off. Since the first switch transistor M1 is turned on and provides a signal with a high potential of the pull-up node A_n to the first control node B, the potential of the first control node B is at a high potential, and the third switch transistor M3 is turned on under the control of the first control node B. Since the third switch transistor M3 is turned on and provides a signal with a low potential of the touch switch terminal CS to the second control node C, the potential of the second control node C is at a low potential, and the fourth switch transistor M4 is turned off under the control of the second control node C. Therefore, in this phase, the pull-up node A_n+1 is no longer compensated, however, since the time interval of this phase is very small, the potential of the pull-up node A_n+1 would not be reduced, but still remains at a high potential.

In the fourth display phase D4, the signal output terminal Output_n+1 of the next stage of shift register unit output a gate turn-on signal, A_n=0, Output_n+1=1, VSS=0, CS=0. Since A_n=0, the first switch transistor M1 is turned off. Since Output_n+1=1, the second switch transistor M2 is turned on. Since the second switch transistor M2 is turned on and provides a signal with a low potential of the reference signal terminal VSS to the first control node B, the potential of the first control node B is at a low potential, and the third switch transistor M3 is turned off, therefore there is no influence on A_n+1 in this phase, so that a normal output of the (n+1)th shift register unit can be ensured.

Figure 6A:
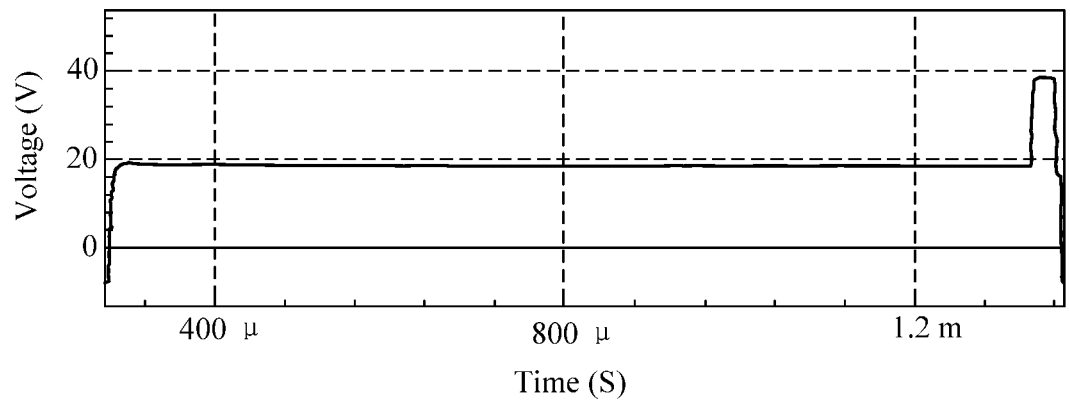
FIG. 6a is a potential test diagram of a pull-up node of a next stage of shift register connected to a node potential compensation unit in a gate driving circuit according to an embodiment of the present disclosure.
Figure 6B:
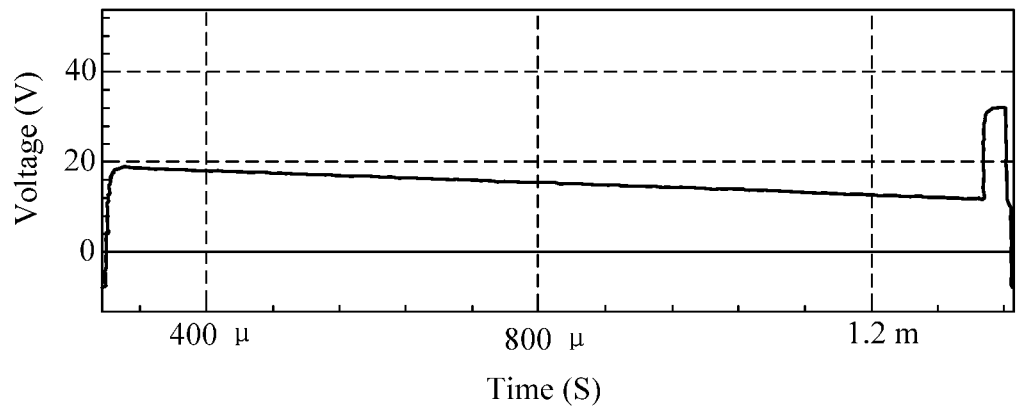
FIG. 6b is a potential test diagram of a pull-up node of a shift register in an existing gate driving circuit.

For the gate driving circuit according to an embodiment of the disclosure, when the touch phase is inserted after the gate turn-on signal is outputted by the nth shift register unit, the potential test result of the pull-up node of the (n+1)th shift register unit is illustrated in FIG. 6a; whereas for the existing gate driving circuit, when the touch phase is inserted after the gate turn-on signal is outputted by the nth shift register unit, the potential test result of the pull-up node of the (n+1)th shift register unit is illustrated in FIG. 6b. It can be seen from comparison that, in the existing gate driving circuit, there is a reduction in the potential of the pull-up node of the (n+1)th shift register unit in the touch phase, while in the above embodiments, due to the compensation effect of the node potential compensation unit, the potential of the pull-up node of the (n+1)th shift register unit is relatively stable.

Embodiment II

Figure 5B:
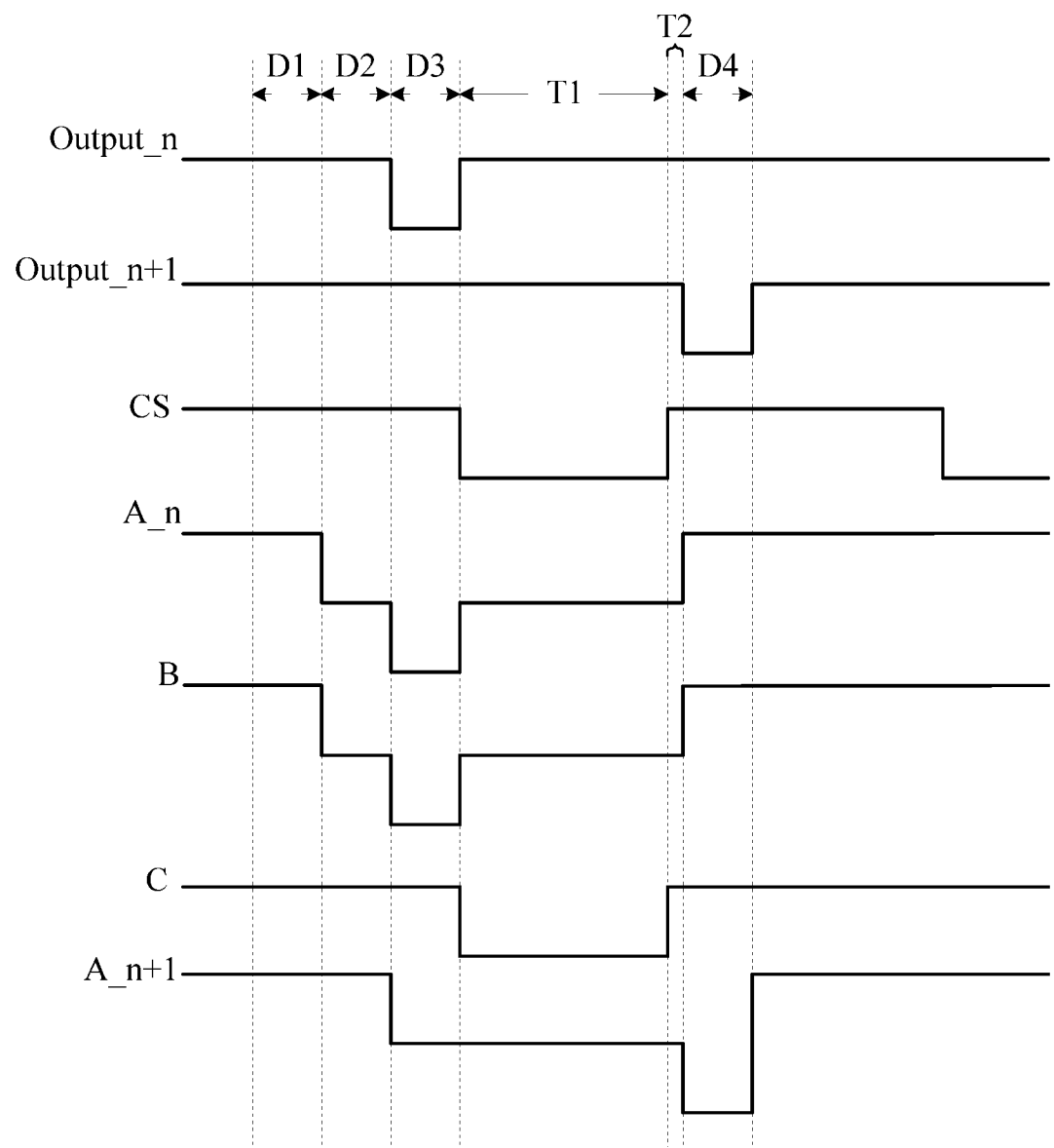
FIG. 5b is a circuit timing diagram of the node potential compensation unit illustrated in FIG. 4b.

The gate driving circuit as illustrated in FIG. 4b is taken as an example to describe its operation procedure. All of the switch transistors in the node potential compensation unit are P-type switch transistors. The potential of reference signal terminal VSS is at a high potential. The potential of the touch switch terminal CS is at a low potential in a preset period T1 of the touch phase, and is always at a high potential at other times. The corresponding input/output timing diagram is illustrated in FIG. 5a, in particular, six phases—a first display phase D1, a second display phase D2, a third display phase D3, a preset period T1 of the touch phase, a period T2 between the end of the preset period and the end of the touch phase, and a fourth display phase D4—in the input/output timing diagram as illustrated in FIG. 5b are selected.

In the first display phase D1, A_n=1, Output_n+1=1, VSS=1, CS=1. Since A_n=1, the first switch transistor M1 is turned off. Since Output_n+1=1, the second switch transistor M2 is turned off. Therefore, the third switch transistor M3 and the fourth switch transistor M4 do not operate, thus in this phase, the node potential compensation unit does not operate and there is no influence on A_n+1.

In the second display phase D2, A_n=0, Output_n+1=1, VSS=1, CS=1. Since A_n=0, the first switch transistor M1 is turned on. Since Output_n+1=1, the second switch transistor M2 is turned off. Since the first switch transistor M1 is turned on, and provides a signal with a low potential of the pull-up node A_n to the first control node B, the potential of the first control node B is at a low potential, and the third switch transistor M3 is turned on under the control of the first control node B. Since the third switch transistor M3 is turned on and provides a signal with a high potential of the touch switch terminal CS to the second control node C, the potential of the second control node C is at a high potential, and the fourth switch transistor M4 is turned off under the control of the second control node C, therefore there is no influence on A_n+1 at this phase.

In the third display phase D3, the pull-up node A_n is further pulled down in this phase, A_n=0, Output_n+1=1, VSS=1, CS=1. Since A_n=0, the first switch transistor M1 is turned on. Since Output_n+1=1, the second switch transistor M2 is turned off. Since the first switch transistor M1 is turned on, and provides a signal with a low potential of the pull-up node A_n to the first control node B, the potential of the first control node B is at a low potential, and the third switch transistor M3 is turned on under the control of the first control node B. Since the third switch transistor M3 is turned on and provides a signal with a high potential of the touch switch terminal CS to the second control node C, the potential of the second control node C is at a high potential, and the fourth switch transistor M4 is turned off under the control of the second control node C, therefore there is no influence on A_n+1 in this phase. However, in this phase, the signal output terminal of the nth shift register unit outputs a gate turn-on signal, and the gate turn-on signal is used as an input signal to the (n+1)th shift register unit, therefore, the pull-up node A_n+1 of the (n+1)th shift register unit is at a high potential.

In the preset period T1 of the touch phase, A_n=0, Output_n+1=1, VSS=1, CS=0. Since A_n=0, the first switch transistor M1 is turned on. Since Output_n+1=1, the second switch transistor M2 is turned off. Since the first switch transistor M1 is turned on, and provides a signal with a low potential of the pull-up node A_n to the first control node B, the potential of the first control node B is at a low potential, and the third switch transistor M3 is turned on under the control of the first control node B. Since the third switch transistor M3 is turned on and provides a signal with a low potential of the touch switch terminal CS to the second control node C, the potential of the second control node C is at a low potential, and the fourth switch transistor M4 is turned on under the control of the second control node C. Since the fourth switch transistor M4 is turned on and provides the signal with a low potential of the touch switch terminal CS to the pull-up node A_n+1, the potential of the pull-up node A_n+1 is at a low potential, so as to compensate for the potential of the pull-up node A_n+1.

In the period T2 between the end of the preset period and the end of the touch phase, A_n=0, Output_n+1=1, VSS=1, CS=1. Since A_n=0, the first switch transistor M1 is turned on. Since Output_n+1=1, the second switch transistor M2 is turned off. Since the first switch transistor M1 is turned on and provides a signal with a low potential of the pull-up node A_n to the first control node B, the potential of the first control node B is at a low potential, and the third switch transistor M3 is turned on under the control of the first control node B. Since the third switch transistor M3 is turned on and provides a signal with a high potential of the touch switch terminal CS to the second control node C, the potential of the second control node C is at a high potential, and the fourth switch transistor M4 is turned off under the control of the second control node C. Therefore, in this phase, the pull-up node A_n+1 is no longer compensated, however, since the time interval of this phase is very small, the potential of the pull-up node A_n+1 would not be reduced, but still remains as high potential.

In the fourth display phase D4, the signal output terminal Output_n+1 of the next stage of shift register unit outputs a gate turn-on signal, A_n=1, Output_n+1=0, VSS=1, CS=1. Since A_n=1, the first switch transistor M1 is turned off. Since Output_n+1=0, the second switch transistor M2 is turned on. Since the second switch transistor M2 is turned on and provides a signal with a high potential of the reference signal terminal VSS to the first control node B, the potential of the first control node B is at a high potential, and the third switch transistor M3 is turned off, therefore there is no influence on A_n+1 in this phase, so that a normal output of the (n+1)th shift register unit can be ensured.

Regarding the gate driving circuit according to an embodiments of the disclosure, since the node potential compensation module does not affect a potential of a pull-up node of a next stage of shift register unit connected thereto in a display phase, and only compensates for the potential of the pull-up node of the next stage of shift register unit in a touch phase, therefore, when pull-up nodes of any two adjacent shift register units in the gate driving circuit are connected to each other via the node potential compensation unit, the touch phase may be inserted after a gate turn-on signal is outputted by any one stage of shift register units, until a gate turn-on signal is outputted by a next stage of shift register unit, so that the touch phase is not restricted.

Based on the same concept, an embodiment of the disclosure also provides a touch display panel, including any one of the gate driving circuit according to the above embodiments of the disclosure. Specifically, the specific structure of the gate driving circuit in the touch display panel is the same with that of the gate driving circuit according to the present disclosure in terms of function and structure, therefore repeated description is omitted here.

Based on the same concept, an embodiment of the disclosure also provides a display apparatus, including any one of the touch display panel described above. For example, the display apparatus may be a mobile phone, a tablet computer, a TV set, a display, a notebook computer, a digital photo frame, a navigator and any product or component with a display function. Any necessary parts of the display apparatus are apparent to those skilled in the art, the description thereof is omitted here, and is not intended to limit the scope of the disclosure. The implementation of the display apparatus may refer to the implementation of the above gate driving circuit, and repeated description is omitted here.

The embodiments of the disclosure provide a gate driving circuit, touch display panel and display apparatus, in which a node potential compensation unit connected to a touch switch terminal is provided between pull-up nodes of two stages of shift register units of each preset unit group in at least one preset unit group. The node potential compensation unit may compensate for, under the control of both of a pull-up node of a previous stage of shift register unit and the touch switch terminal, a potential of a pull-up node of a next stage of shift register unit connected to the node potential compensation unit, in a preset period of a touch phase. Compared with the exiting gate driving circuit in which a potential reduction in the pull-up node of the next stage of shift register unit is caused by insertion of a touch phase with a relatively large time interval between two partly adjacent shift register units outputting gate turn-on signals, the gate driving circuit according to an embodiment of the disclosure may enable the potential of the pull-up node of the next stage of shift register unit to be in a stable state in a preset period of the touch phase by providing the node potential compensation unit, so as to improve the stability of the potential of the gate turn-on signal output by the next stage of shift register unit, thereby enabling a TFT of a pixel region in a corresponding line to be normally turned on and improving a display performance.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

We claim:

1. A gate driving circuit, comprising multiple cascaded shift register units, each stage of the cascaded shift register units at least comprising a signal input terminal, a signal output terminal and a pull-up node for controlling the signal output terminal to output a gate turn-on signal, and each signal input terminal of remaining other stages of the cascaded shift register units except for a first stage of the cascaded shift register units is connected to a signal output terminal of a previous stage of the cascaded shift register units, wherein, any two adjacent stages of the cascaded shift register units constitute a unit group, the gate driving circuit further comprises at least one node potential compensation unit, each of which is connected between pull-up nodes of the two adjacent stages of the cascaded shift register units in at least one preset unit group, and the node potential compensation unit is further connected to a touch switch terminal, and each node potential compensation unit is configured to compensate for, under the control of both a pull-up node of a previous stage of the cascaded shift register units in the unit group connected to the node potential compensation unit and the touch switch terminal, a potential of a pull-up node of a next stage of the cascaded shift register units in the unit group, in a preset period of a touch phase.

2. The gate driving circuit according to claim 1, wherein in the gate driving circuit, the node potential compensation unit is provided between pull-up nodes of the two adjacent stages of the cascaded shift register units of each unit group in all of the unit groups.

3. The gate driving circuit according to claim 1, wherein the node potential compensation unit comprises:

an input control module, having a first terminal connected to the pull-up node of the previous stage of the cascaded shift register units in the unit group connected to the node potential compensation unit, and a second terminal connected to a first control node, the input control module being used to provide, under the control of the pull-up node of the previous stage of the cascaded shift register units, a signal of the pull-up node of the previous stage of the cascaded shift register units to the first control node;

a reset control module, having a first terminal connected to a signal output terminal of the next stage of the cascaded shift register units in the unit group, a second terminal connected to a reference signal terminal, and a third terminal connected to the first control node, the reset control module being configured to provide, under the control of the signal output terminal, a signal of the reference signal terminal to the first control node;

a potential control module, having a first terminal connected to the first control node, a second terminal connected to the touch switch terminal, and a third terminal connected to a second control node, the potential control module being configured to provide, under the control of the first control node, a signal of the touch switch terminal to the second control node; and a potential output module, having a first terminal connected to the second control node, a second terminal connected to the touch switch terminal, and a third terminal connected to the pull-up node of the next stage of the cascaded shift register units in the unit group, the potential output module being configured to provide, under the control of the second control node, a signal of the touch switch terminal to the pull-up node of the next stage of shift register unit.

4. The gate driving circuit according to claim 3, wherein the input control module comprises a first switch transistor, and the first switch transistor has a gate, a source that is first terminal of the input control module, and a drain that is the second terminal of the input control module.

5. The gate driving circuit according to claim 3, wherein the reset control module comprises a second switch transistor, and the second switch transistor has a gate that is the first terminal of the reset control module, a source that is the second terminal of the reset control module, and a drain that is the third terminal of the reset control module.

6. The gate driving circuit according to claim 3, wherein the potential control module comprises a third switch transistor, and the third switch transistor has a gate that is the first terminal of the potential control module, a source that is the second terminal of the potential control module, and a drain that is the third terminal of the potential control module.

7. The gate driving circuit according to claim 3, wherein the potential output module comprises a fourth switch transistor, and the fourth switch transistor has a gate that is the first terminal of the potential output module, a source that is the second terminal of the potential output module, and a drain that is the third terminal of the potential output module.

8. The gate driving circuit according to claim 4, wherein the gate turn-on signal is at a high potential, and the first switch transistor is a N-type switch transistor; or, the gate turn-on signal is at a low potential, and the first switch transistor is a P-type switch transistor.

9. The gate driving circuit according to claim 5, wherein the gate turn-on signal is at a high potential, and the second switch transistor is a N-type switch transistor; or, the gate turn-on signal is at a low potential, and the second switch transistor is a P-type switch transistor.

10. The gate driving circuit according to claim 6, wherein the gate turn-on signal is at a high potential, and the third switch transistor is a N-type switch transistor; or, the gate turn-on signal is at a low potential, and the third switch transistor is a P-type switch transistor.

11. The gate driving circuit according to claim 7, wherein the gate turn-on signal is at a high potential, and the fourth switch transistor is a N-type switch transistor; or, the gate turn-on signal is at a low potential, and the fourth switch transistor is a P-type switch transistor.

12. A touch display panel, comprising the gate driving circuit according to claim 1.

13. A display apparatus, comprising the touch display panel according to claim 12.

\* \* \* \* \*